(12) United States Patent
Flueckiger et al.

(10) Patent No.: US 11,342,596 B2
(45) Date of Patent: May 24, 2022

(54) METHOD AND SYSTEM FOR CONTROLLING A RECHARGEABLE BATTERY

(71) Applicants: ABB Schweiz AG, Baden (CH); Hitachi Energy Switzerland AG, Baden (CH)

(72) Inventors: Reto Flueckiger, Zürich (CH); Timothy Patey, Zürich (CH); Jan Poland, Nussbaumen (CH)

(73) Assignees: Hitachi Energy Switzerland AG, Baden (CH); ABB Schweiz AG, Baden (CH)

( * ) Notice: Subject to any disclaimer, the term of this patent is extended or adjusted under 35 U.S.C. 154(b) by 70 days.

(21) Appl. No.: 16/820,150

(22) Filed: Mar. 16, 2020

(65) Prior Publication Data
US 2020/0227791 A1 Jul. 16, 2020

Related U.S. Application Data

(63) Continuation of application No. PCT/EP2018/074760, filed on Sep. 13, 2018.

(30) Foreign Application Priority Data

Sep. 14, 2017 (EP) .................................... 17191155

(51) Int. Cl.
*H01M 10/42* (2006.01)
*H01M 10/48* (2006.01)
(Continued)

(52) U.S. Cl.
CPC ...... *H01M 10/4257* (2013.01); *G01R 31/367* (2019.01); *H01M 10/486* (2013.01); *H02J 7/0048* (2020.01); *H01M 2010/4271* (2013.01)

(58) Field of Classification Search
CPC .......... H01M 10/4257; H01M 10/486; H01M 2010/4271; H01M 10/42; H01M 10/48; G01R 31/367; H02J 7/0048; H02H 7/00
(Continued)

(56) References Cited

U.S. PATENT DOCUMENTS

| 2013/0090900 A1* | 4/2013 | Gering ................ G01R 31/392 703/2 |
| 2014/0278167 A1 | 9/2014 | Frost et al. |

(Continued)

OTHER PUBLICATIONS

European Patent Office, International Search Report & Written Opinion issued in corresponding Application No. PCT/EP2018/074760, dated Nov. 2, 2018, 14 pp.

(Continued)

*Primary Examiner* — Sun J Lin
(74) *Attorney, Agent, or Firm* — Slater Matsil, LLP

(57) ABSTRACT

A battery management system for a rechargeable battery is disclosed which includes a control system configured to control, a numerical battery model, including a parametrized electric model; a parametrized thermal model; an aging model configured to provide stress parameters indicative of an instantaneous consumption of an expected lifetime of the battery in dependence on an internal temperature of the battery, and one or more of momentary state of charge, current, voltage and power delivered; updated electric parameters and/or updated thermal parameters based on a chronological sequence of internal temperature as obtained from the parametrized thermal model; a control system settings update unit configured to adapt controller settings based on stress parameters.

22 Claims, 4 Drawing Sheets

(51) Int. Cl.
*H02J 7/00* (2006.01)
*G01R 31/367* (2019.01)

(58) Field of Classification Search
USPC .......................................... 320/134
See application file for complete search history.

(56) References Cited

U.S. PATENT DOCUMENTS

2015/0046105 A1* 2/2015 Guntreddi .......... G01R 31/3835
702/63
2015/0326038 A1 11/2015 Lee
2017/0092996 A1 3/2017 Rodriguez et al.

OTHER PUBLICATIONS

European Patent Office, Extended Search Report issued in corresponding Application No. 17191155.5, dated Mar. 2, 2018, 7 pp.

* cited by examiner

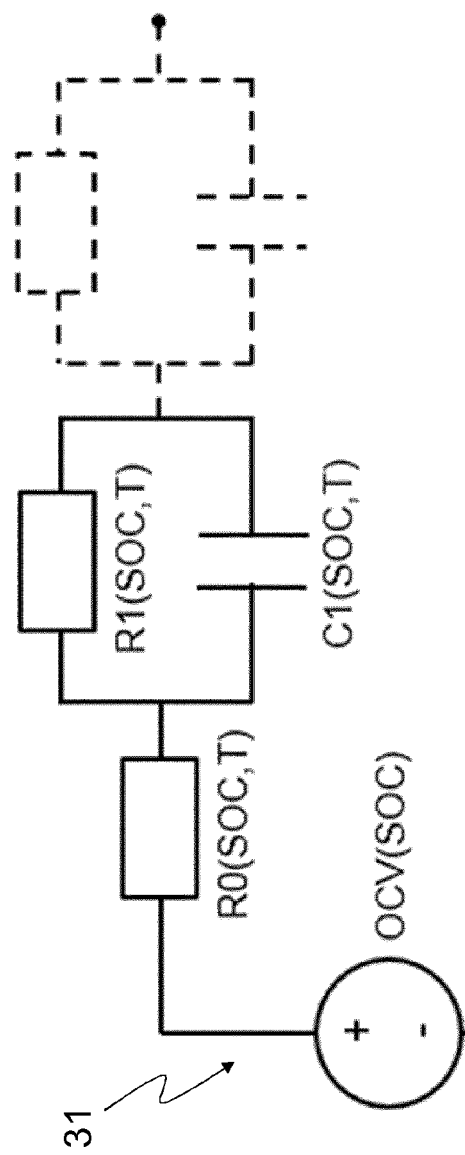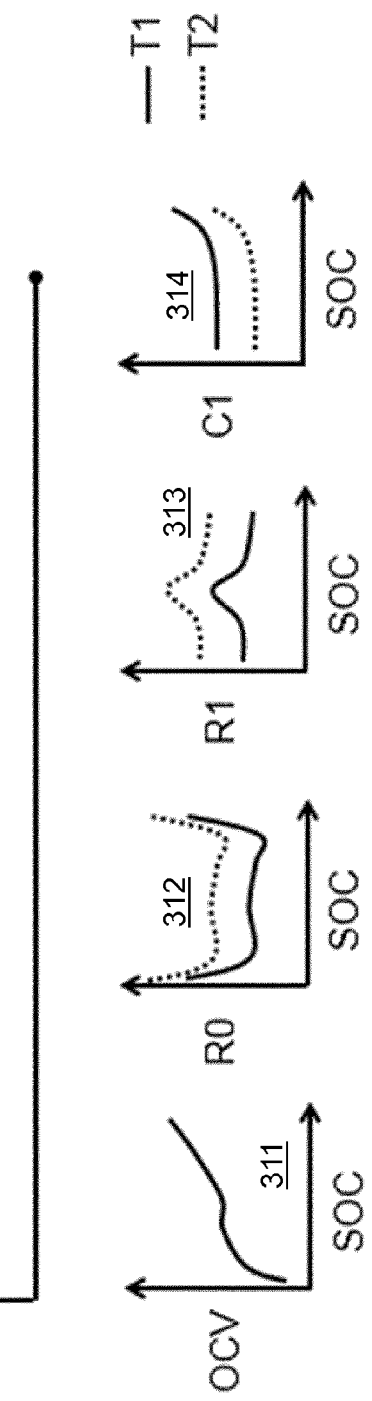
Fig. 2

METHOD AND SYSTEM FOR CONTROLLING A RECHARGEABLE BATTERY

FIELD OF THE INVENTION

The invention pertains to the field of rechargeable batteries. In particular, it relates to a method and a battery management system for controlling a rechargeable battery based on a self-calibrating battery model for advanced diagnostic and control, in accordance with the independent patent claims.

BACKGROUND OF THE INVENTION

Electrochemical batteries, briefly referred to as batteries in what follows, which generally form the basis of battery energy storage systems, age over time. Battery aging is a complex process, which takes place even if a battery is not utilized at all. Aging progresses faster as the battery is cycled, i.e. repeatedly charged and discharged. The impact of the respective charge/discharge cycles is cumulative over time and their impact on aging is greater as electrochemical and thermal stress on a battery increases, for example via higher rates of charging or discharging, or too low or too high states of charge, which all lead to some extent of irreversible physical and chemical changes inside the battery cells. Therefore, an aging behavior heavily depends on a cell design and chemistry of the battery, but also on a way according to which the battery is operated. Aging leads to increased losses but, more importantly, it reduces a capacity of the battery to hold charge, which in turn reduces both the power and the energy the battery can provide. Since power and energy are critical aspects of services intended to be provided by a battery, aging effects need to be carefully considered at various stages, in particular at a design phase.

Models for analysing an ageing behavior have, e.g., been described in "A holistic ageing model for Li(NiMnCo)$O_2$ based 18650 lithium-ion batteries", by J. Schmalstieg et al., Journal of Power Sources 257 (2014), 325-334; which is hereby included by reference in its entirety.

Batteries for critical and/or high-performance applications have therefore usually been characterized with extensive a priori testing. Consequently it used to take considerable amounts of time—sometimes up to several years—until a battery system could be designed optimally with a reduced safety margin. In the absence of detailed a priori knowledge related to an aging behavior of a battery, a fixed and reduced operational range was often used in order to allow a safe operation from beginning to end of life. This tends to make batteries larger, more expensive and less competitive than may actually be necessary.

The energy and power density of batteries is currently increasing by a rate of 5-8% per year. Material limits will be successively approached and consequently safety limits reduced. An accurate diagnosis and safe control of batteries thus becomes more difficult and at the same time more important. New cell types and chemistries appear faster and faster with less and less empirical data available for a complete characterization before commissioning. This changes the way battery or energy management and monitoring systems are built and operated.

To allow for optimum integration and optimal and safe control of a battery in an overall system, an adequate and efficient battery management system (BMS), as e.g. described in principle in US 2015/326038 A1 or US 2014/278167 A1, is required. Such battery management system may be part of a primary or higher level energy management system (EMS). In addition, the term energy management system may sometimes be used as a synonym for battery management system. In terms of hardware is to be expected that the BMS will become a commodity but with ever increasing computational power.

A BMS should thus be capable of addressing, in particular, the following problems and challenges:

In the future, batteries are likely to have lower safety margins due to an increase in energy density and cost pressure.

Safe battery operation in heavy duty applications needs detailed knowledge of how voltage limits of the battery are influenced by temperature, rate of charge/discharge and aging.

Due to shorter time to market less empirical data will be available to understand the aging behavior a priori.

A safe and/or optimal operating window is changing over the lifetime and needs to be appropriately adapted dynamically in order to maximize safety and performance.

Environmental conditions of the battery can vary suddenly, influencing the

A load profile as applied by an end user is often unknown a priory.

SUMMARY OF THE INVENTION

It is thus an objective of the invention to provide a system and a method capable of addressing and solving the problems as laid out above. This objective and further objectives are solved by a battery management system as defined in independent claim 1, and by a method for controlling state of charge, current, voltage and/or power delivered by or to a battery as defined in independent claim 9.

A battery management system for a rechargeable battery (1) in accordance with the present invention comprises
  a) a control system (2) configured to control, in dependence on one or more control system settings, one or more of:
    i) current,
    ii) voltage,
    iii) power delivered by or to the battery and
    iv) state of charge;
  b) a numerical battery model (3), comprising
    i) a parametrized electric model (31) describing the battery in terms of an equivalent electric circuit characterized by a plurality of electric parameters;
    ii) a parametrized thermal model (32) capable of estimating, based on a plurality of thermal parameters, an internal temperature of the battery as a function of current, voltage and/or power delivered by or to the battery;
    iii) an aging model (33) configured to provide
      (1) stress parameters indicative of a an instantaneous consumption of an expected lifetime of the battery in dependence on an internal temperature of the battery, and one or more of momentary state of charge, current, voltage and power delivered;
      (2) updated electric parameters and/or updated thermal parameters based on a chronological sequence of internal temperature as obtained from the parametrized thermal model, and preferably one or more of momentary state of charge, current, voltage and power delivered;

c) a control system settings update unit (21) configured to adapt controller settings based on stress parameters.

A method for controlling state of charge, current, voltage and/or power delivered by or to a battery (1) in accordance with the invention comprises the steps of:

a) providing a control system (2) for controlling said quantities in dependence on one or more control system settings under a closed-loop control scheme;

b) providing a numerical battery model (3), comprising
  i) a parametrized electric model (31) describing the battery in terms of an equivalent electric circuit characterized by a plurality of electric parameters;
  ii) a parametrized thermal model (32) capable of estimating, based on a plurality of thermal parameters, an internal temperature of the battery as a function of current, voltage and/or power delivered by or to the battery;
  iii) an aging model (33) configured to provide
    (1) stress parameters indicative of a an instantaneous consumption of an expected lifetime of the battery in dependence on the internal temperature of the battery, and one or more of momentary state of charge, current, voltage and power delivered;
    (2) updated electric and/or updated thermal parameters based on a chronological sequence of internal temperature as obtained from the parametrized thermal model, and preferably one or more of momentary state of charge, current, voltage and power delivered;

c) determining initial values for the stress parameters and/or the plurality of electric and thermal parameters;

d) operating the battery under control of the controller with said controller settings;

e) periodically updating the numerical battery model, in particular the electric and thermal parameters;

f) selecting updated control system settings based on a given operational range for state of charge, current, voltage, and/or internal temperature;

g) repeating steps d) to f).

The control system may, in particular, be a standard closed-loop control system, in particular a multi-input-multi-output (MIMO) closed-loop control system, of a type as such known to a person skilled in the art, and may control one, two or more operational variables of an electrochemical battery, an ensemble comprising a plurality of electrochemical battery cells electrically connected in parallel and/or in series, and/or an individual electrochemical battery cell, during charging and/or discharging cycles and/or when idle. As such, operational variables may be one or more of, in particular, a current I, a voltage V and a power P provided and/or delivered by the battery, in particular during a discharging cycle, or to the battery, in particular during a charging cycle. State of charge (SoC), depth of discharge (DoD), and/or temperature T, in particular internal temperature $T_{cell}$ of the battery, may also be regarded as operational variables. One or more of the operational variables may be controlled variables of the control system; wherein the control system may control one or more of instant values, average values, time dependence of values, etc. The control system may, in particular, employ PID control.

The parametrized electric model may, in particular, be an equivalent circuit model (ECM) with a voltage source having an open circuit voltage (OCV) $V_{OC}$ that is SoC dependent, and one serial resistor $R_0$ that is SoC and optionally temperature dependent (R0). Optionally, this ECM may be extended by dynamical components, e.g. RC-loops, where each RC loop is specified by a resistance and a capacitance (or, equivalently, a resistance and a time constant)

The parametrized thermal model may, in particular, be any numerical model that allows estimating an internal temperature or temperature distribution of the battery, in particular the battery cells, as a function of voltage, current and/or power applied to or delivered by the battery, as well as any temperature measurements available, wherein thermal parameters, e.g. thermal resistance or thermal conductivities, flow rates and thermal capacity of a coolant, ambient temperature etc. may be taken into account. The calculated internal temperature or temperature distribution may then preferably be passed back to the electric model for adjusting electric parameters.

The ageing model, may, in particular, be a numerical model that provides quantitative information related to two main aspects of battery ageing, in the form of stress parameters indicative of an instantaneous consumption of lifetime, and updated model parameters. Battery ageing in this sense may be regarded as a consumption of a remaining lifetime of a battery, with said lifetime being consumed through use of the battery and/or through passing of time, at a rate that may dependent qualitatively and/or quantitatively on a number of quantities, in particular the operational quantities as mentioned above, which may in turn depend on time. Within the ageing model, remaining lifetime may be represented by a quantity L referred to as remaining expected lifetime which may, in particular, be expressed by a function L(t) of time t, with said function taking values between 1 and 0, with L=1 corresponding to a new and/or unused battery, and L=0 corresponding to a battery that may, should and/or can no longer be used for its intended purpose. It is to be understood that remaining expected lifetime is a model quantity that may be regarded as estimation or forecast of a remaining actual lifetime, wherein remaining expected lifetime and remaining actual lifetime may differ. The ageing model may, on the one hand, provide updated model parameters based on information related to a correlation between the remaining lifetime of a battery and various model parameters, in particular electric parameters of the parametrized electric model and/or thermal parameters of the parametrized thermal model. On the other hand, the ageing model may provide stress parameters in the form of an estimate of a rate of an instantaneous consumption of remaining expected lifetime, which may, in particular, correspond to a derivative of L(t) with respect to time, i.e. dL(t)/dt, in particular as functions of stress factors as in particular state of charge (SOC), depth of discharge (DOD), temperature and/or current (C-rate). Stress parameters may, in particular be defined as partial derivatives of a stress-factor-dependent remaining expected lifetime function L(t, ... ), in particular L(t, I, V, P, $T_{cell}$, SoC, DoD), i.e. e.g. $\partial L(t, I, V, P, T_{cell}, SoC, Dod)/\partial I$, $\partial L)t, I, V, P, T_{cell}, SoC, DoD)/\partial V$, $\partial L(t, I, V, P, T_{cell}, SoC, DoD)/\partial P$, $\partial L(t, I, V, P, T_{cell}, SoC, DoD)/\partial T_{cell}$, $\partial L(t, I, V, P, T_{cell}, SoC, DoD)/\partial SoC$, and/or $\partial L(t, I, V, P, T_{cell}, SoC, DoD)/\partial DoD$. The lifetime function L(t, I, V, P, $T_{cell}$, SoC, DoD) may not necessarily depend on all operational variables, in particular stress parameters, I, V, P, $T_{cell}$, SoC, DoD, as indicated by the expression L(t, ... ). It may depend, in particular, only on a—preferably non-empty—subset of a set of quantities comprising I, V, P, $T_{cell}$, SoC, and DoD, in particular any combination of two or three operational variables.

The calculated internal temperature or temperature distribution obtained by means of the parametrized thermal model may preferably be passed also to the aging model for adjusting stress parameters related to internal temperature and for updating electric parameters and/or thermal parameters.

The information related to the correlation between the remaining estimated lifetime of a battery and various model parameters, may, in particular, be provided in the form of look-up tables, through parametrized functions, fitted curves of various types, etc.

The control system settings update unit, or the selecting of updated control system settings, may, in particular, adapt setpoints or set values of the control system and/or update or adapt operational limits, or set operational rules for the battery, in accordance with data obtained by means of the numerical battery model, in particular comprising stress parameters as described above.

Preferably, the parametrized electric model, the parametrized thermal model, and/or the ageing model are repeatedly updated, in particular between successive charge and/or discharge cycles; or repeatedly, e.g. at regular intervals, during charge and/or discharge cycles, and/or at regular intervals independent of charging and discharging cycles.

Using operational data, in particular operational variables, the parametrized electric model may be updated, preferably in combination with prior knowledge. Because of a nonlinearity of the electrical model, with characteristic curves for open circuit voltage, internal resistances, capacitances being related to state of charge in a nonlinear manner, the preferable way of doing so is by maintaining lookup tables of the relevant quantities and re-calibrating them using operational data, while prior knowledge is incorporated in the form of rules (e.g. open circuit voltage increases monotonically in SoC).

In a preferred variant of the system and method in accordance with the invention, initial values for the stress parameters and/or the plurality of electric and thermal parameters are obtained, in particular, when a new battery is used or a battery is used for the first time. Such initial values may, in particular, be available from the manufacturer, or obtained through a specified test procedure the battery is subjected to. The initial values may be relatively unreliable, i.e. exhibit relatively strong deviations from correct values.

Updated values for stress parameters and/or the plurality of electric and thermal parameters may subsequently be derived by means of a state of health (SoH) estimation and/or degradation estimation. In addition or alternatively, dedicated diagnostic cycles may be carried out, wherein after every diagnostic cycle, a real capacity decrease $\Delta Q_r$ and a resistance increase $\Delta R_r$ are cross-checked with corresponding model predictions $\Delta Q_m$ and $\Delta R_m$, respectively. An offset and a history of the battery operational variables may preferably be used to recalibrate stress parameters until an offset is zero. The preferable way to perform this recalibration is a model-based approach, where some stress factors may enter the model in a parameterized way. Internal temperature, e.g., may preferably enter via Arrhenius' law. Other stress factors may be taken into account by lookup tables. As a result, a self-calibrating battery model for electric and thermal parameters and ageing is obtained that accounts for historical data from the connected battery and makes an estimation of remaining lifetime more and more accurate, instead of diverging from the initial design life as state of the art batteries, as in the prior art.

In a preferred variant of the system and method in accordance with the invention, the numerical battery model may communicate summary statistics and/or detailed information to a network based service or a cloud service and/or collect information from there. In this way, the model update can benefit from different operational plants/installations, which possibly even run with different applications and may hence provide complementary information. This allows for the following positive implications:
  The requirement for extensive a priori characterization of the battery is significantly reduced;
  the safety of the battery is increased;
  new service business cases are possible as every battery always may report the latest mean time to failure prediction;
  such an adaptive model allows a later upgrade of the storage capacity, the replacement of faulty modules or packs with new ones ore even the use of unpredictable automotive batteries in a second life application; and
  in particular, an online calibrated ECM allows more precise estimation of future heat losses.

In a preferred variant of the system and method in accordance with the invention, the control system employs model predictive control for controlling one or more of the operational variables of the battery, wherein the model employed by the controller comprises the parametrized electric model and/or the parametrized thermal model as described above.

The continuously updated battery model may be used in combination with model predictive control, e.g. by using the model inside a planning/optimization step to optimize the battery operation. In particular, stress parameters updated by means of the aging model may be used to allow for health-conscious control. Updated operational limits, rules and/or targets may be set for the battery according to the forecast obtained through the numerical battery model. For example, if the model detects an amplified ageing at a certain SoC level the controller of the battery may be configured to automatically try and avoid a range around said SoC level, thereby increasing the lifetime and safety of the battery. Further, if the numerical battery model should predict that a particular operation or operation range—as characterized by operational parameters—would cause a high temperature in the battery, then the controller would de-rate the power of that future operation or initiate a preemptive cooling sequence. A recalibrated electric model also provides the possibility to predict the available power at any SOH, SOC, temperature and current level. This allows early an adaptation of charge and discharge power profiles, in particular charge and discharge rates, should this power limit be exceeded. Another opportunity is the optimization of the overall system performance, e.g. energy efficiency, by operation of the system closer to its limits and/or in favorable operational ranges.

The invention allows for an adaptive estimation of the battery health, in particular remaining expected lifetime, including electrical, thermal, and ageing model. This may, in particular be used for:
  predictive/prescriptive maintenance (e.g. preparing a battery service in a given or predetermined amount of time, in particular x months, based on the health estimation, or adapting the battery load such that a next service window is optimally met, etc.
  load balancing in case of multiple parallel batteries (e.g. one battery is ageing faster and hence gets reduced load)
  consequences on setpoint changes in the overall system, e.g. HVAC, temperature, SoC operation window, C rate limits, etc.

Embodiments of the invention may involve one or more electronic or computing devices, and/or involve the use of such devices. Said devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. In particular, the battery management system, the control system may, and/or the control system settings update unit may be partially or fully implemented on such electronic or computing devices, individually or jointly.

The methods described herein may be may be partially or fully implemented as or in the form of software, which may in turn be encoded as executable instructions embodied in a non-transitory computer readable medium, including, without limitation, a storage device and/or a memory device. Such instructions, when executed by a processing device, cause the processing device to perform at least a portion of the methods described herein, preferably in real-time. The above examples are exemplary only, and thus are not intended to limit in any way the definition and/or meaning of the term processor and processing device.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc—read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

As used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The present disclosure also includes embodiments with any combination of features which are mentioned or shown above and/or below, in various embodiments or variants. It also includes individual features as shown in the Figures, even if they are shown there in connection with other features and/or are not mentioned above or below. The disclosure comprises embodiments which exclusively comprise the features described in the claims or the exemplary embodiments, as well as those which comprise additional other features.

The above and other aspects of the invention will become apparent from and elucidated with reference to the embodiments described hereinafter.

BRIEF DESCRIPTION OF THE DRAWINGS

The subject matter of the invention will be explained in more detail in the following text with reference to exemplary embodiments which are illustrated in the attached drawings, of which:

FIG. 2 shows an exemplary embodiment of a parametrized electric model to be used as part of a battery management system or method according to the present invention;

DETAILED DESCRIPTION OF EXEMPLARY EMBODIMENTS

Figure 1:
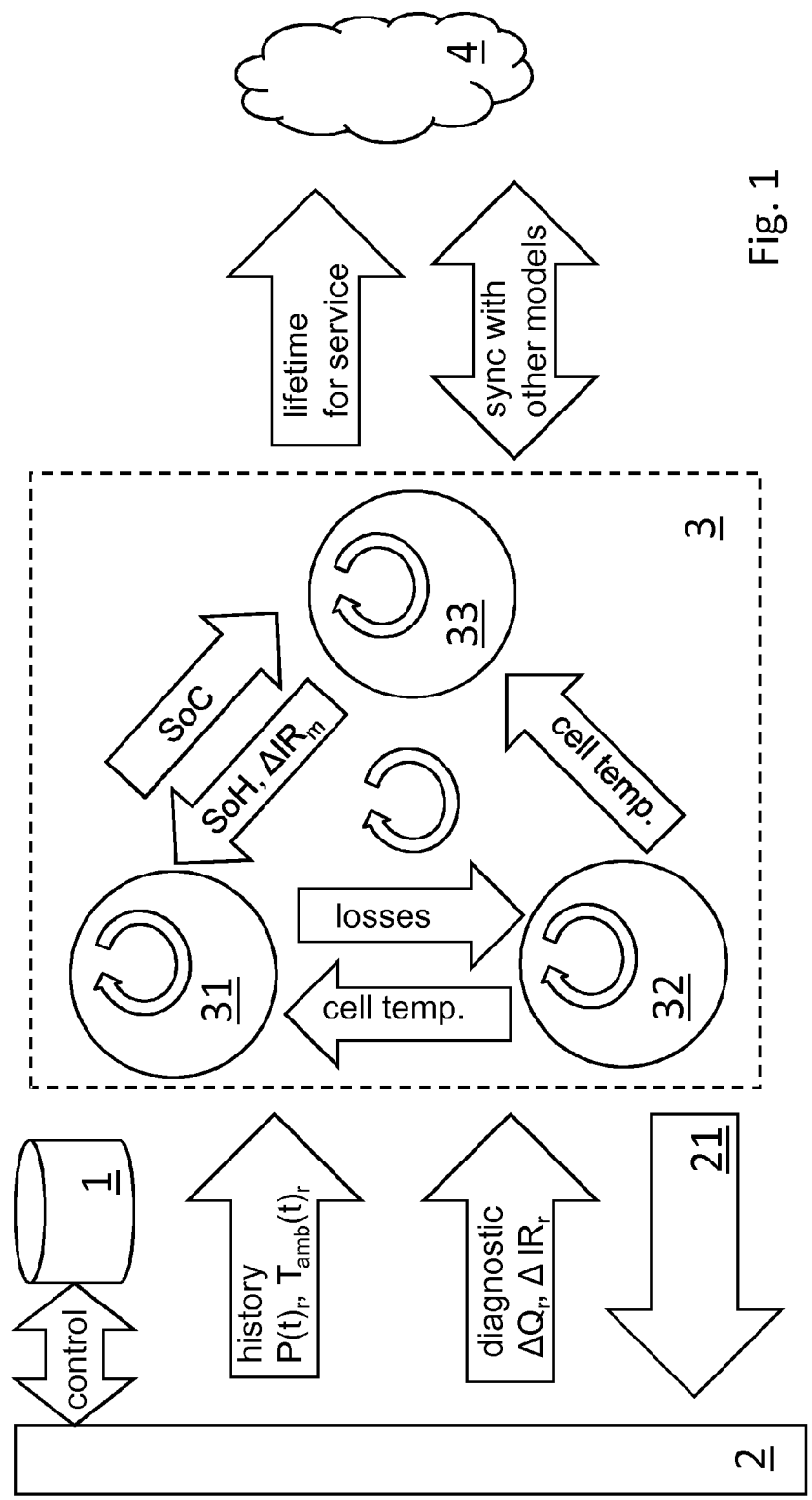
FIG. 1 shows an exemplary embodiment of a battery management system and of a method for controlling operational variables of a battery in accordance with the present invention.

FIG. 1 shows an exemplary embodiment of a battery management system and of a method for controlling operational variables of a battery 1, which is controlled by a closed loop control system 2.

The battery management system comprises a numerical battery model 3, which in turn comprises a parametrized electric model 31, a parametrized thermal model 32, and an ageing model 33.

FIG. 2 shows an exemplary embodiment of a parametrized electric model 31 to be used as part of a battery management system or method according to the present invention. The parametrized electric model 31 is an equivalent circuit model with a voltage source characterized by state-of-charge (SoC) dependent open circuit voltage ($V_{OC}$), one serial resistor, a resistance $R_0$ of which is SoC dependent and optionally dependent on temperature T, in particular internal battery temperature $T_{cell}$; and at least one RC element electrically connected in series with the serial resistor, and comprising an RC resistor and an RC capacitor electrically connected in parallel, with the RC resistor having a resistance $R_1$ and the RC capacitor having a capacitance $C_1$, wherein $R_1$ and $C_1$ are also dependent on SoC, and, optionally, on temperature T, in particular internal battery temperature $T_{cell}$. SoC is exemplary defined as a ratio between the cumulative charge in the battery as determined by $\int I \, dt$ and an actual full charge capacity (FCC).

The curves 311, 312, 313 and 314 illustrate exemplary relationships between state of charge and open circuit voltage, $R_0$, $R_1$ and $C_1$, respectively, for two different internal battery temperatures T1 and T2>T1.

Figure 3:
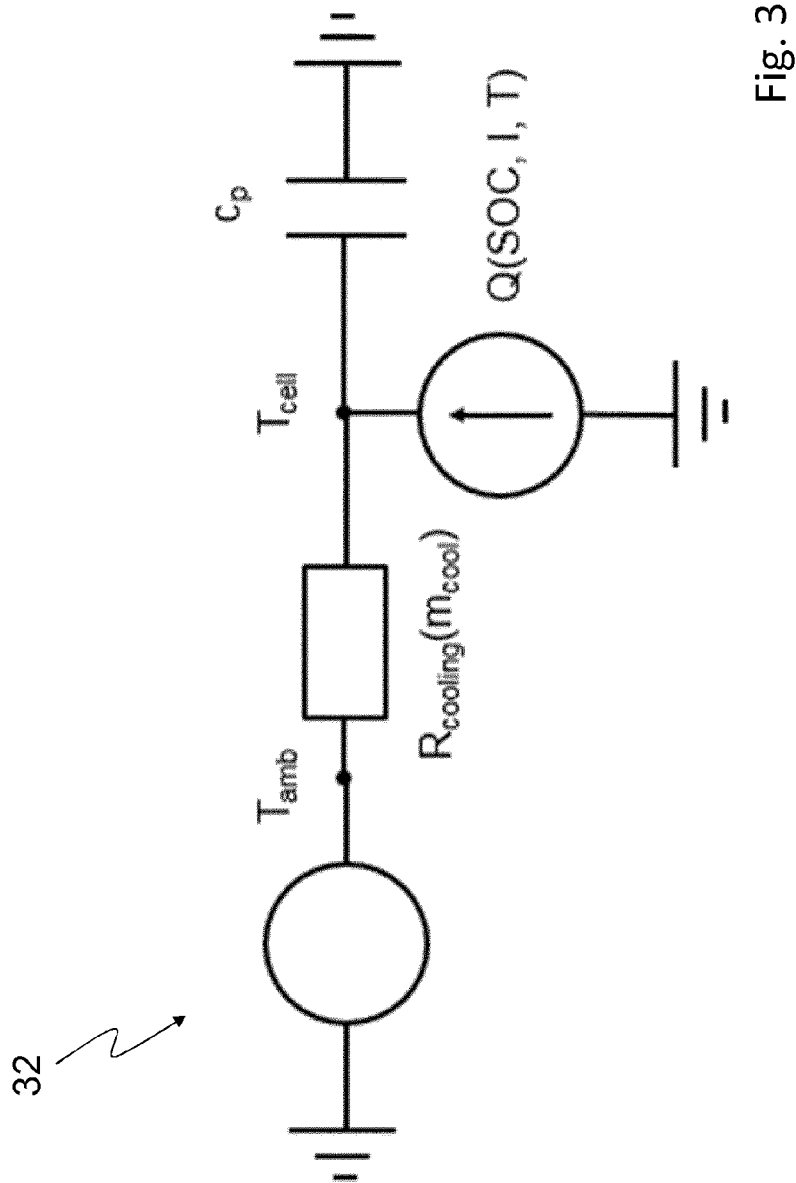
FIG. 3 shows an exemplary embodiment of a parametrized thermal model to be used as part of a battery management system or method according to the present invention.

FIG. 3 shows an exemplary embodiment of a parametrized thermal model 32 to be used as part of a battery management system or method according to the present invention. The parametrized thermal model 32 is a thermal network model with two temperature nodes: average, internal cell temperature $T_{cell}$ and ambient temperature $T_{amb}$. Heat Q as generated by electric losses within the battery is SOC, current and optionally temperature dependent and is calculated by the electric model. The battery has a capacity to store the heat ($c_p$) before it is dissipated through a thermal resistance $R_{cooling}$ which thermal resistance may be dependent on a flow rate $m_{cool}$ of a cooling fluid.

The calculated internal temperature is subsequently passed back to the electric model to adjust the electric properties and to the aging model to adjust the temperature stress factor.

Figure 4:
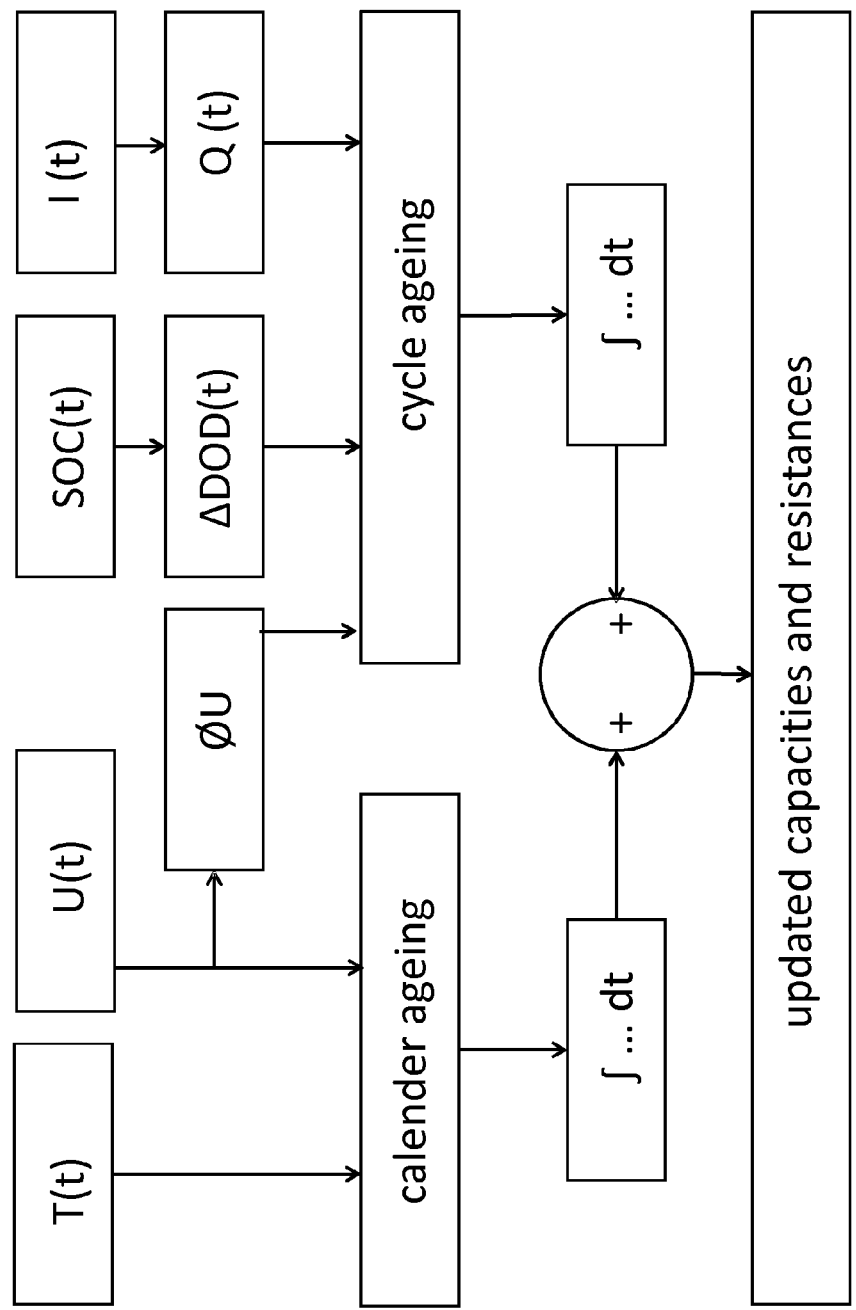
FIG. 4 shows an exemplary embodiment of a calculation process used as part of the ageing model for obtaining updated electric parameters in accordance with the present invention.

FIG. 4 illustrates an exemplary embodiment of a calculation process used as part of the ageing model for obtaining updated electric parameters. The aging model comprises a semi-empirical model of how the capacity and the resistance degrade over time and cycle. It has a calendar aging A part and a cycle aging B part with different exponents $\hat{\alpha}, \hat{\beta}, \alpha, \beta$.

$$\Delta/R_m - 1 = A_R^{\hat{\alpha}} + B_R^{\hat{\beta}}$$

$$1 - \Delta Q_m = A_Q^{\alpha} + B_Q^{\alpha}$$

State of charge (SOC), depth of discharge (DOD), temperature and current (C-rate) are main contributors to ageing behavior and have a certain functional form. Said quantities are integrated over time and summed up over cycles to account for irregular conditions, i.e.

$$A_R = \int a_R(t) dt \text{ and } A_Q = \int a_Q(t) dt;$$

$$B_R = \Sigma b_R(i) \text{ and } B_Q = \Sigma b_Q(i).$$

The FCC may be recalibrated based on output from the ageing model, in particular by predicting a relative decrease in capacity predicted trough the ageing model $\Delta Q_m$ and multiplying it with an initial capacity $C_{init}$:

$$SOC = \frac{Q}{FCC} = \frac{\int I dt}{C_{init} \cdot \Delta Q_m}$$

The resistances $R_0$ and $R_1$, and optionally other resistances that may be contained in the parametrized electric model 31, are recalibrated with the relative resistance increase predicted by the ageing model $\Delta IR_m$ according to $Rx = Rx_0 \cdot \Delta IR_m$. The capacitances of the exemplary embodiment of the parametrized electric model as are assumed to not be affected by ageing.

The invention claimed is:

1. A battery management system for a battery that is rechargeable, comprising:
   a control system configured to control, in dependence on one or more control system settings, one, two or more of:
   current, delivered by or to the battery,
   voltage across the battery,
   power delivered by or to the battery, and
   state of charge of the battery;
   a numerical battery model, comprising:
   a parametrized electric model describing the battery in terms of an equivalent electric circuit comprising a plurality of electric parameters;
   a parametrized thermal model capable of estimating, based on a plurality of thermal parameters, an internal temperature of the battery as a function of current, voltage and/or power delivered by or to the battery; and
   an aging model configured to provide:
   a remaining expected lifetime function indicating a remaining expected lifetime of the battery;
   stress parameters indicative of an instantaneous consumption of the remaining expected lifetime of the battery in dependence on the internal temperature of the battery, and one or more of momentary state of charge, current, voltage and power delivered, wherein at least one stress parameter is defined as a partial derivative of the remaining expected lifetime function; and
   updated values for the plurality of electric parameters and/or updated values for the plurality of thermal parameters based on a chronological sequence of internal temperature as obtained from the parametrized thermal model; and
   a control system settings update unit configured to adapt the control system settings based on the stress parameters, wherein the control system settings comprise at least one of setpoints, set values, operational limits or operational rules.

2. The battery management system of claim 1, wherein the control system is further configured to control the internal temperature of the battery through a closed loop control scheme.

3. The battery management system of claim 1, wherein the control system is based on model predictive control using the parametrized electric and thermal models of the numerical battery model.

4. The battery management system of claim 1, wherein the equivalent electric circuit of the parametrized electric model comprises a voltage source and a serial resistor connected in series with the voltage source.

5. The battery management system of claim 4, wherein the equivalent electric circuit of the parametrized electric model comprises an RC element connected in series with the serial resistor, said RC element comprising an RC resistor and an RC capacitor connected in parallel.

6. The battery management system of claim 1, wherein numeric values for at least one of the plurality of electric parameters depend on the internal temperature of the battery.

7. The battery management system of claim 1, wherein numeric values for at least one of the plurality of electric parameters depend on instantaneous state of charge (SoC) of the battery.

8. The battery management system of claim 1, wherein the aging model is configured to be updated to take into account differences between updated model parameters and corresponding observed parameters, wherein the updated model parameters include the updated values for the plurality of electric parameters and the updated values for the plurality of thermal parameters.

9. The battery management system of claim 1, wherein the remaining expected lifetime function is denoted as L(t, I, V, P, $T_{cell}$, SoC, DoD), wherein t is time, I is the current delivered by or to the battery, V is the voltage delivered by or to the battery, P is the power delivered by or to the battery, $T_{cell}$ is the internal temperature of the battery, SoC is the state of charge of the battery, and DoD is the depth of discharge of the battery.

10. The battery management system of claim 9, wherein the at least one stress parameter is defined according to $\partial L(t, I, V, P, T_{cell}, SoC, Dod)/\partial I$, $\partial L)t, I, V, P, T_{cell}, SoC, DoD)/\partial V$, $\partial L(t, I, V, P, T_{cell}, SoC, DoD)/\partial P$, $\partial L(t, I, V, P, T_{cell}, SoC, DoD)/\partial T_{cell}$, $\partial L(t, I, V, P, T_{cell}, SoC, DoD)/\partial SoC$, or $\partial L(t, I, V, P, T_{cell}, SoC, DoD)/\partial DoD$.

11. The battery management system according to of claim 1, wherein the control system is configured to control, in dependence on the one or more control system settings, exactly one of
current, delivered by or to the battery,
voltage across the battery,
power delivered by or to the battery, and
state of charge of the battery.

12. The battery management system of claim 1, wherein the numerical battery model is connected to a cloud service, wherein numerical battery models of other batteries are also connected to the cloud service, wherein the numerical battery model is configured to exchange information with the numerical battery models of the other batteries through the cloud service, and is configured to provide the updated values for the electric parameters and/or updated values for the thermal parameters using the information from the numerical battery models of the other batteries.

13. The battery management system of claim 1, wherein the numerical battery model is a software model and is configured to be run on a computing device.

14. A method for controlling quantities that include one, two or more of a state of charge, a current, a voltage and/or a power delivered by or to a battery, the method comprising:
providing a control system for controlling said quantities in dependence on one or more control system settings under a closed-loop control scheme, wherein the control system settings comprise at least one of setpoints, set values, operational limits or operational rules;
providing a numerical battery model, comprising:
a parametrized electric model describing the battery in terms of an equivalent electric circuit comprising a plurality of electric parameters;
a parametrized thermal model capable of estimating, based on a plurality of thermal parameters, an internal temperature of the battery as a function of current, voltage and/or power delivered by or to the battery; and
an aging model configured to provide:
a remaining expected lifetime function indicating a remaining expected lifetime of the battery;
stress parameters indicative of an instantaneous consumption of the remaining expected lifetime of the battery in dependence on the internal temperature of the battery, and one or more of momentary state of charge, current, voltage and power delivered, wherein at least one of the stress parameters is defined as a partial derivative of the remaining expected lifetime function; and
updated values for the electric parameters and/or updated values for the thermal parameters based on a chronological sequence of internal temperature as obtained from the parametrized thermal model;
determining initial values for the stress parameters and/or the plurality of electric and thermal parameters;
operating the battery under control of a controller with said control system settings;
periodically updating the numerical battery model, in particular the electric and thermal parameters;
selecting updated control system settings based on a given operational range for state of charge, current, voltage, and/or internal temperature of the battery; and
repeating said acts of operating the battery, periodically updating the numerical battery model and selecting updated control system settings.

15. The method of claim 14, wherein the control system is further configured to control the internal temperature of the battery through the closed-loop control scheme.

16. The method of claim 15, wherein in said operating the battery, the battery is operated under model predictive control using the parametrized electric and thermal models of the numerical battery model.

17. The method of claim 14, wherein in said periodically updating the numerical battery model, the numerical battery model is updated using output from the aging model.

18. The method of claim 14, wherein in said periodically updating the numerical battery model, the numerical battery model is updated using a diagnostic routine.

19. The method of claim 14, further comprising connecting the numerical battery model to a cloud service, wherein the cloud service is connected to other numerical models of other batteries, wherein in said periodically updating the numerical battery model, the numerical battery model is updated using data obtained from the other batteries connected to the cloud service.

20. The method of claim 14, further comprising the act of repeatedly updating the aging model to take into account differences between updated model parameters and corresponding observed parameters.

21. The method of claim 14, wherein the remaining expected lifetime function is denoted as L(t, I, V, P, $T_{cell}$, SoC, DoD), wherein t is time, I is the current delivered by or to the battery, V is the voltage delivered by or to the battery, P is the power delivered by or to the battery, $T_{cell}$ is the internal temperature of the battery, SoC is the state of charge of the battery, and DoD is the depth of discharge of the battery.

22. The method according to claim 21, wherein the at least one stress parameter is defined according to $\partial L(t, I, V, P, T_{cell}, SoC, Dod)/\partial I$, $\partial L)t, I, V, P, T_{cell}, SoC, DoD)/\partial V$, $\partial L(t, I, V, P, T_{cell}, SoC, DoD)/\partial P$, $\partial L(t, I, V, P, T_{cell}, SoC, DoD)/\partial T_{cell}$, $\partial L(t, I, V, P, T_{cell}, SoC, DoD)/\partial SoC$, or $\partial L(t, I, V, P, T_{cell}, SoC, DoD)/\partial DoD$.

* * * * *